(12) United States Patent
Maggay (10) Patent No.: US 12,267,940 B2
(45) Date of Patent: Apr. 1, 2025

(54) APPARATUS AND METHODS FOR NANOPLASMA SWITCHES

(71) Applicant: Analog Devices International Unlimited Company, Limerick (IE)

(72) Inventor: Romulo Maggay, Calabarzon (PH)

(73) Assignee: Analog Devices International Unlimited Company, Limerick (IE)

( * ) Notice: Subject to any disclaimer, the term of this patent is extended or adjusted under 35 U.S.C. 154(b) by 126 days.

(21) Appl. No.: 18/191,327

(22) Filed: Mar. 28, 2023

(65) Prior Publication Data

US 2024/0334584 A1    Oct. 3, 2024

(51) Int. Cl.
*H03K 17/73*    (2006.01)
*H01J 17/02*    (2006.01)
*H05H 1/46*    (2006.01)
*H05K 1/16*    (2006.01)

(52) U.S. Cl.
CPC ............. *H05H 1/4645* (2021.05); *H05K 1/16* (2013.01); *H05K 2201/09381* (2013.01); *H05K 2201/09409* (2013.01); *H05K 2201/0949* (2013.01); *H05K 2201/10053* (2013.01)

(58) Field of Classification Search
CPC .... H03K 17/693; H03K 17/73; H03K 17/731; H03K 17/735; H03K 17/88; H01H 9/12; H01H 9/14; H01H 2300/036; H05H 1/4645; H05K 1/16; H05K 2201/09381; H05K 2201/09409; H05K 2201/0949; H05K 2201/10053; H01J 17/00; H01J 17/02; H01J 17/04; H01J 17/06; H01J 17/10; H01J 37/3222; H01J 37/32247; H01J 37/32321; H01J 37/32339; H01T 4/08; H01T 4/10
See application file for complete search history.

(56) References Cited

U.S. PATENT DOCUMENTS

2016/0149287 A1*  5/2016  Lam .................. H01Q 1/002
                                                    200/61.03
2023/0360875 A1*  11/2023  Matioli ............ H01J 37/32321

FOREIGN PATENT DOCUMENTS

EP          3 024 086 A1    5/2016
WO    WO 2021/190955 A1    9/2021

OTHER PUBLICATIONS

International Search Report and Written Opinion for International Application No. PCT/EP2024/055734 dated Jun. 13, 2024 in 12 pages.

(Continued)

*Primary Examiner* — Thai Pham
(74) *Attorney, Agent, or Firm* — Knobbe, Martens, Olson & Bear, LLP (57) ABSTRACT

Apparatus and methods for nanoplasma switches are disclosed. In certain embodiments, a nanoplasma switching system includes a nanoplasma radio frequency (RF) switch that receives an RF signal, and a nanoplasma DC switch that receives a DC bias voltage. The nanoplasma DC switch is positioned adjacent to but spaced apart from the nanoplasma RF switch. The nanoplasma DC switch induces a nanoplasma through the nanoplasma RF switch when the DC bias voltage is set to a first voltage level. By implementing the nanoplasma switching system in this manner, DC bias to turn on or off the nanoplasma RF switch can be realized without needing to use passive components such as DC blocking capacitors, choke inductors, or baluns for isolation.

20 Claims, 7 Drawing Sheets

(56) References Cited

OTHER PUBLICATIONS

Nikoo et al., "Beyond 8 THz Displacement-field Nano-switches for 5G and 6G Communications" 2021 IEEE International Electron Devices Meeting (IEDM) in 4 pages.

* cited by examiner

FIG.5C ly charged conductor and
APPARATUS AND METHODS FOR NANOPLASMA SWITCHES

FIELD OF THE DISCLOSURE

Embodiments of the invention relate to electronic systems, and more particularly, to nanoplasma switches for radio frequency (RF) communications.

BACKGROUND

A radio frequency (RF) communication system can include RF switches used for a variety of purposes, such as control over routing of RF signals, connectivity between components or circuits, and/or to provide various other switching functions. In one example, an RF communication system can include an RF switch in a transmit path, for instance, to selectively connect an antenna to an output of a power amplifier. In another example, an RF communication system can include an RF switch in a receive path, for instance, to selectively connect an antenna to an input of a low noise amplifier.

Examples of RF communication systems with one or more RF switches include, but are not limited to, base stations, mobile devices (for instance, smartphones or handsets), laptop computers, tablets, Internet of Things (IoT) devices, and/or wearable electronics.

SUMMARY OF THE DISCLOSURE

Apparatus and methods for nanoplasma switches are disclosed. In certain embodiments, a nanoplasma switching system includes a nanoplasma radio frequency (RF) switch that receives an RF signal, and a nanoplasma DC switch that receives a DC bias voltage. The nanoplasma DC switch is positioned adjacent to but spaced apart from the nanoplasma RF switch. The nanoplasma DC switch induces a nanoplasma through the nanoplasma RF switch when the DC bias voltage is set to a first voltage level. By implementing the nanoplasma switching system in this manner, DC bias to turn on or off the nanoplasma RF switch can be realized without needing to use passive components such as DC blocking capacitors, choke inductors, or baluns for isolation.

In one aspect, a nanoplasma switching system is disclosed. The nanoplasma switching system includes a nanoplasma radio frequency (RF) switch configured to receive an RF signal, and a first nanoplasma DC switch configured to receive a DC bias voltage. The first nanoplasma DC switch is positioned adjacent to and spaced apart from the nanoplasma RF switch. The first nanoplasma DC switch is operable to induce a nanoplasma through the nanoplasma RF switch when the DC bias voltage is set to a first voltage level.

In another aspect, a circuit board is provided. The circuit board includes a substrate, a nanoplasma radio frequency (RF) switch formed over the substrate, and a first nanoplasma DC switch formed over the substrate and positioned adjacent to and spaced apart from the nanoplasma RF switch. The nanoplasma RF switch is configured to receive an RF signal, and the first nanoplasma DC switch is configured to receive a DC bias voltage. The first nanoplasma DC switch is operable to induce a nanoplasma through the nanoplasma RF switch when the DC bias voltage is set to a first voltage level.

In another aspect, a method of radio frequency (RF) switching is provided. The method includes providing an RF signal to a nanoplasma RF switch, providing a DC bias voltage to a first nanoplasma DC switch that is positioned adjacent to and spaced apart from the nanoplasma RF switch, and inducing a nanoplasma through the nanoplasma RF switch using the first nanoplasma DC switch by setting the DC bias voltage to a first voltage level.

DETAILED DESCRIPTION OF EMBODIMENTS

The following detailed description of embodiments presents various descriptions of specific embodiments of the invention. However, the invention can be embodied in a multitude of different ways. In this description, reference is made to the drawings. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A nanoplasma switch includes a first conductive pad and a second conductive pad separated by a gap having a nanometer range size. Additionally, a strong electric field can be applied between the pads to create a nanoplasma short for RF signals. This phenomenon follows the field emission in which many free electrons are forced to move between the gap. The high electric field and gap size below the electron's mean free path enables ultrafast switching. The first conductive pad of the nanoplasma switch serves as an input port, while the second conductive pad of the nanoplasma switch serves as an output port.

Conventional nanoplasma switches are two-port devices in which the input port receives both a direct current (DC) bias signal and a radio frequency (RF) signal. To accommodate the presence of both DC and RF signals on the same port, passive components can be included to provide isolation. For example, a DC blocking capacitor, choke inductor, and/or balun can be used to provide isolation between DC and RF. Although passive components can be used for isolating DC and RF, such isolation structures increase circuit cost and/or area.

Thus, typical two-port nanoplasma switches suffer from additional components used to block DC, isolate RF, and prevent cross-over modulations.

Apparatus and methods for nanoplasma switches are provided. In certain embodiments, a nanoplasma switching system includes a nanoplasma RF switch that receives an RF signal, and a nanoplasma DC switch that receives a DC bias voltage. The nanoplasma DC switch is positioned adjacent to but spaced apart from the nanoplasma RF switch. The nanoplasma DC switch induces a nanoplasma through the nanoplasma RF switch when the DC bias voltage is set to a first voltage level.

By implementing the nanoplasma switching system in this manner, DC bias to turn on or off the nanoplasma RF switch can be realized without needing to use passive components such as DC blocking capacitors, choke inductors, or baluns for isolation. Rather, the DC bias can be controlled using a separate DC bias path that is physically separated from the RF signal path.

Furthermore, the voltage level of the DC bias voltage can be controlled to selectively induce a nanoplasma through the nanoplasma RF switch to thereby turn on or off the nanoplasma RF switch as desired. Thus, the DC bias voltage applied to the nanoplasma DC switch controls the electric field near the gap of the nanoplasma RF switch, thereby inducing the nanoplasma to turn on the nanoplasma RF switch when needed. For example, the DC bias voltage can be set to the first voltage level to induce the nanoplasma such that the nanoplasma RF switch is turned on, or to a second voltage level in which the nanoplasma is not induced such that the nanoplasma RF switch is turned off.

In certain implementations, the nanoplasma RF switch includes a first metal pad and a second metal pad separated by a gap having a nanometer range size. Additionally, the DC bias voltage provided to the nanoplasma DC switch is capable of inducing the nanoplasma through the gap to effect an RF short. The nanoplasma DC switch can also include a pair of metal pads separated by a nano-gap.

Thus, the nanoplasma DC switch serves as a two-port nano-gap bias structure that is placed closely to the nanoplasma RF switch to selectively induce a nanoplasma that controls the state of the nanoplasma RF switch.

To provide enhanced control over the nanoplasma, multiple nanoplasma DC switches can be placed closely to the nanoplasma RF switch. For example, a first nanoplasma DC switch can be placed on a first side of the nanoplasma RF switch, and a second nanoplasma DC switch can be placed on a second side of the nanoplasma RF switch.

In certain implementations, the nanoplasma switching system is implemented on a circuit board (for example, a printed circuit board). In one example, the nanoplasma switching system can be configured in a planar implementation in which a DC switch path is placed on one or both sides of an RF switch path on a layer of the circuit board. In another example, the nanoplasma switching system can be configured in a vertical implementation in which an RF switch path is formed on a layer of the circuit board, and DC switch paths are placed on layers above and/or below the RF switch path to provide a multi-layer/vertical implementation. For example, top and bottom layers can serve as DC switch paths, while a middle layer can serve as the RF switch path. Furthermore, a cavity or trench is formed across the multi-layer gaps. Furthermore, implementations using both horizontal and vertical positioning of the DC switch paths can be used, for example, enclosed implementations in which DC switch paths are provided around the RF switch path.

Thus, schemes of biasing a nanoplasma RF switch are provided by physically separating the DC bias path from the RF path. Additionally, one or more DC bias nano-gap structures (nanoplasma DC switches) are proximally located to the main RF path to effect a nanoplasma short.

The nanoplasma RF switches herein can handle RF signals of a wide range of frequencies, including not only those between 3 MHz and 7 GHZ, but also higher frequencies, such as those in the X band (about 7 GHZ to 12 GHZ), the $K_u$ band (about 12 GHZ to 18 GHZ), the K band (about 18 GHz to 27 GHZ), the $K_a$ band (about 27 GHz to 40 GHZ), the V band (about 40 GHz to 75 GHZ), and/or the W band (about 75 GHZ to 110 GHZ). Accordingly, the teachings herein are applicable to a wide range of radio frequencies, including microwave frequencies.

Moreover, the nanoplasma RF switches can handle RF signals associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

Figure 1A:
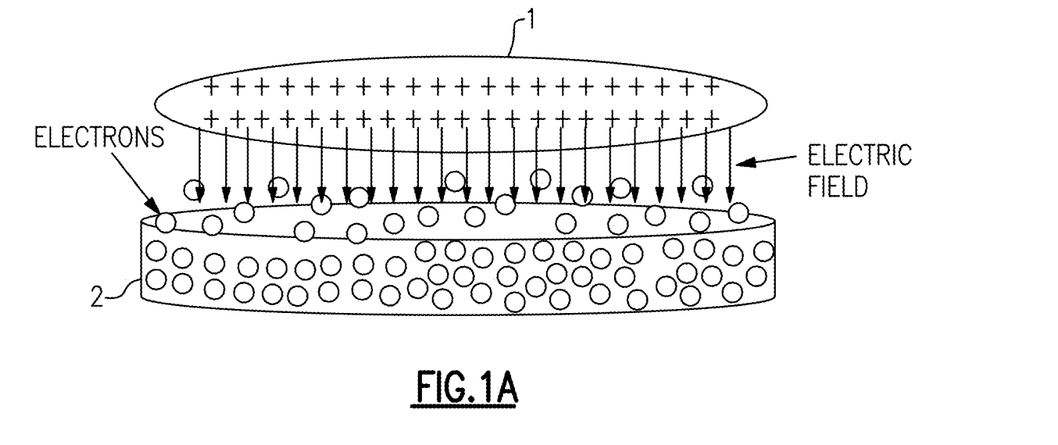
FIG. 1A is a schematic diagram of one example of electric field generation between a positively charged conductor and a metal surface of a plate.

FIG. 1A is a schematic diagram of one example of electric field generation between a positively charged conductor 1 and a metal surface 2 of a plate. As shown in FIG. 1A, the positively charged conductor 1 and the metal surface 2 are spaced apart from one another and do not physically contact. For example, the positively charged conductor 1 and the metal surface 2 can be separated by an air gap.

In the illustrated example, electric field emission occurs due to placing the highly-positively charged conductor 1 near the metal surface 2. In particular, the highly-positively charged conductor 1 operates to pull the free electrons from the metal surface 2. Thus, the presence of the highly-positively charged conductor 1 provides sufficient potential to overcome the restrictive force, thereby leading to the pulling of the free electrons from the metal surface 2 of the plate.

Figure 1B:
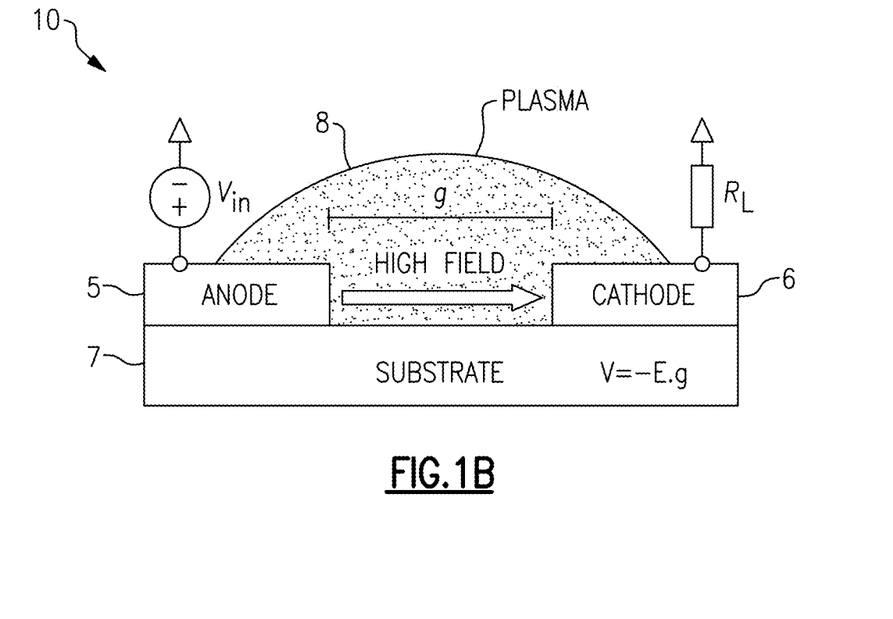
FIG. 1B is a schematic diagram of one example of a nanoplasma switch.

FIG. 1B is a schematic diagram of one example of a nanoplasma switch 10. The nanoplasma switch 10 includes an anode 5 and a cathode 6 formed over a non-conducting substrate 7. The anode 5 and the cathode 6 are separated by a gap g. In certain implementations, the anode 5 and cathode 6 are each implemented as a metal pad.

As shown in FIG. 1B, an input voltage source $V_{in}$ is connected between the anode 5 and ground. Additionally, a load resistor $R_L$ is connected between the cathode 6 and ground. The voltage V of the input voltage source $V_{in}$ can be set to control the strength of the electric field E between the anode 5 and the cathode 6.

The size of the gap g can be selected to be a nano-gap (also referred to herein as a nanoplasma gap or nanometer range size gap) having a size between 5 nm and 5,000 nm.

When the gap g is sized at nano-gap scale, application of a strong electric field (measured in MV/cm) across the anode 5 and the cathode 6 generates a plasma 8. For example, an electric field of at least 1 MV/cm, or more particularly, 5 MV/cm can generate the plasma 8 across the gap g at nanometer range scale. The plasma 8 serves as a short-circuit of high-mobility electrons between the gap g. The plasma 8 enables an ultra-fast sub-ps transition from a non-conducting state to a conducting state.

Figure 1C:
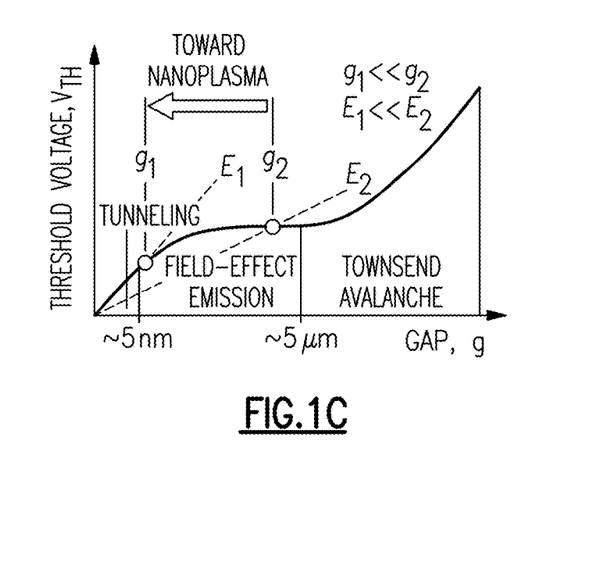
FIG. 1C is a graph of one example of threshold voltage versus gap size.

FIG. 1C is a graph of one example of threshold voltage $V_{TH}$ versus gap size. The gap size represents a separation distance between a first metal pad (an anode) and a second metal pad (a cathode), while the threshold voltage $V_{TH}$ represents a threshold for conduction between the metal pads.

The graph includes three regions, including a tunneling region associated with a gap size of less than about 5 nm, a field-effect emission region associated with a gap size between about 5 nm and about 5,000 nm (5 μm), and a Townsend avalanche region associated with a gap size greater than about 5,000 nm. Electric fields $E_1$ and $E_2$ for threshold conduction across gaps $g_1$ and $g_2$, respectively, are depicted in FIG. 1C.

Nanoplasma gaps are much smaller than the mean-free path of electrons. In contrast, spark-gaps are much larger and operate by ionization. In particular, spark-gaps operate based on compounding collisions of electrons resulting in arcing and/or avalanche.

Figure 2:
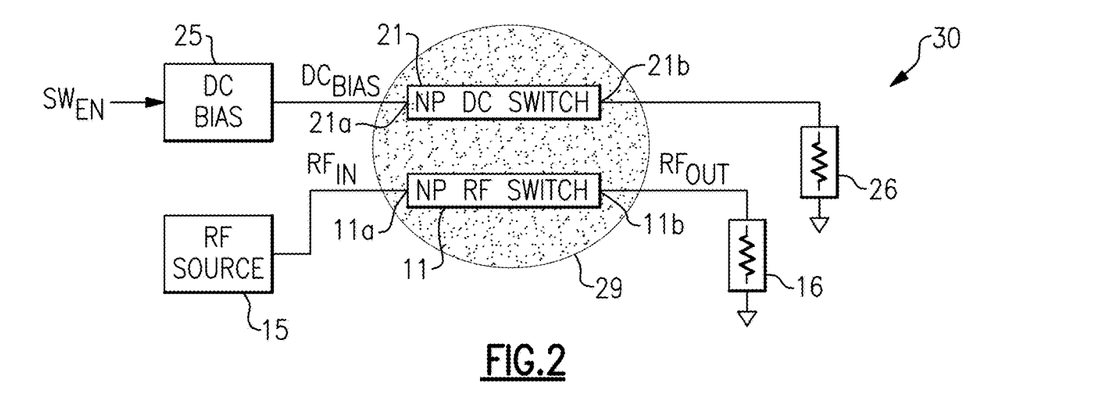
FIG. 2 is a schematic diagram of a nanoplasma switching system according to one embodiment.

FIG. 2 is a schematic diagram of a nanoplasma switching system 30 according to one embodiment. The nanoplasma switching system 30 includes a nanoplasma RF switch 11, an RF signal source 15, a first load 16, a nanoplasma DC switch 21, a DC bias circuit 25, and a second load 26.

In the illustrated embodiment, the RF signal source 15 outputs an RF input signal $RF_{IN}$ that is provided to a first port or terminal 11a of the nanoplasma RF switch 11. Additionally, the first load 16 is connected between a second port 11b of the nanoplasma RF switch 11 and a reference voltage (for example, ground). The first load 16 receives an RF output signal $RF_{OUT}$ from the second terminal 11b of the nanoplasma RF switch 11. When the nanoplasma RF switch 11 is in a conducting state (closed or ON state), the nanoplasma RF switch 11 is low impedance and conducts between the first terminal 11a and the second terminal 11b. However, when the nanoplasma RF switch 11 is in a non-conducting state (open or OFF state), the nanoplasma RF switch 11 is high impedance and provides little to no conduction between the first terminal 11a and the second terminal 11b.

The RF signal source 15 can correspond to any suitable signal source. For example, the RF signal source 15 can represent a wide range of RF circuits including, but not limited to, amplifiers such as power amplifiers (PAs). Additionally, the first load 16 can represent any suitable RF load. For instance, the first load 16 can represent another RF circuit or another RF component, such a filter or antenna.

With continuing reference to FIG. 2, the DC bias circuit 25 outputs a DC bias voltage $DC_{BIAS}$ that is provided to a first port 21a of the nanoplasma DC switch 21. Additionally, the second load 26 is connected between a second port 21b of the nanoplasma DC switch 21 and the reference voltage.

The nanoplasma DC switch 21 is positioned adjacent to but spaced apart from the nanoplasma RF switch 11. The nanoplasma DC switch 21 selectively induces a nanoplasma 29 through the nanoplasma RF switch 11 based on a voltage level of the DC bias voltage $DC_{BIAS}$. Accordingly, DC bias to turn on or off the nanoplasma RF switch 11 can be realized without needing to use passive components such as DC blocking capacitors, choke inductors, or baluns for isolation. Rather, the DC bias can be controlled using a separate DC bias path that is physically separated from the RF signal path.

In the illustrated embodiment, the DC bias circuit 25 receives a switch enable signal $SW_{EN}$, which indicates whether the nanoplasma RF switch 11 should be turned on or turned off. Additionally, the DC bias circuit 25 provides a DC bias voltage $DC_{BIAS}$ to the first port 21a of the nanoplasma DC switch 21.

In certain implementations, the DC bias circuit 25 sets the DC bias voltage $DC_{BIAS}$ to a first voltage level to induce the nanoplasma 29 to turn on the nanoplasma RF switch 11, and to a second voltage level in which the nanoplasma 29 is not induced and the nanoplasma RF switch 11 is turned off. For example, the DC bias circuit 25 can set the DC bias voltage $DC_{BIAS}$ to the first voltage level for a first state of the switch enable signal $SW_{EN}$, and set the DC bias voltage $DC_{BIAS}$ to the second voltage level for a second state of the switch enable signal $SW_{EN}$.

Figure 3A:
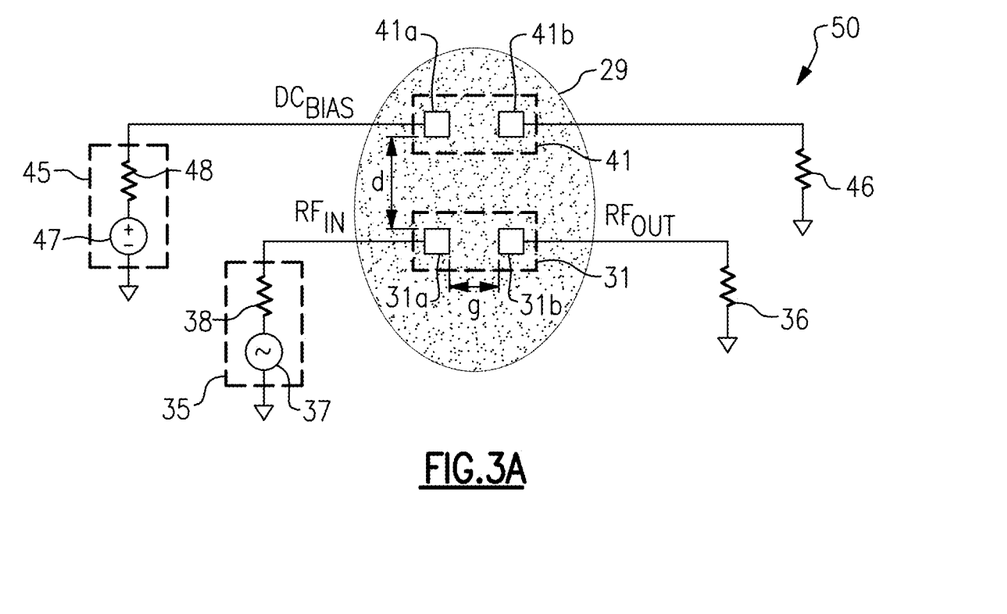
FIG. 3A is a schematic diagram of a nanoplasma switching system according to another embodiment.

FIG. 3A is a schematic diagram of a nanoplasma switching system 50 according to another embodiment. The nanoplasma switching system 50 includes a nanoplasma RF switch 31, an RF signal source 35, an RF path load resistor 36, a nanoplasma DC switch 41, a DC bias circuit 45, and a DC path load resistor 46.

In the illustrated embodiment, the RF signal source 35 is represented as a series combination of an RF voltage source 37 and a series resistor 38. The RF signal source 35 provides an RF input signal $R_{FIN}$ to a first metal pad 31a of the nanoplasma RF switch 31. Additionally, the RF path load resistor 36 is connected between a second metal pad 31b of the nanoplasma RF switch 31 and a reference voltage (for example, ground). The nanoplasma RF switch 31 provides the RF output signal $RF_{OUT}$ at the second metal pad 31b.

As shown in FIG. 3A, the first metal pad 31a and the second metal pad 31b are separated by a gap g. The gap g is a nano-gap. In certain implementations, the gap g has a size between 5 nm and 5,000 nm. The first metal pad 31a and the second metal pad 31b can be separated by any suitable dielectric, which in certain implementations is air. Although the first metal pad 31a and the second metal pad 31b can be separated by air, other dielectrics can also be used.

With continuing reference to FIG. 3A, the DC bias circuit 45 is represented as a series combination of a DC voltage source 47 and a series resistor 48. The DC bias circuit 45 outputs a DC bias voltage $DC_{BIAS}$ that is provided to a first metal pad 41a of the nanoplasma DC switch 41. Additionally, the DC path load resistor 46 is connected between a second metal pad 41b of the nanoplasma DC switch 41 and a reference voltage (for example, ground).

In the illustrated embodiment, the first metal pad 41a and the second metal pad 41b of the nanoplasma DC switch 41 are separated by a nano-gap. Although FIG. 3A depicts an embodiment in which both the nanoplasma RF switch 31 and the nanoplasma DC switch 41 have the same gap size g, the teachings herein are also applicable to configurations in which the nanoplasma RF switch 31 and the nanoplasma DC switch 41 have nano-gaps of different sizes.

As shown in FIG. 3A, the nanoplasma DC switch 41 and the nanoplasma RF switch 31 are spaced apart from one another by a distance d. In the illustrated embodiment, the distance d corresponds to the distance between the first metal pad 41a of the nanoplasma DC switch 41 and the first metal pad 31a of the nanoplasma RF switch 31.

The distance d between the nanoplasma DC switch 41 and the nanoplasma RF switch 31 can be greater than the size of the nano-gap g, but small enough that the DC bias voltage $DC_{BIAS}$ is capable of inducing a nanoplasma 29 through the gap of the nanoplasma RF switch 31 to effect an RF short.

In certain implementations, the distance d is selected to be in the range of 100 µm to 1,000 µm.

Thus, a separate DC bias path is placed proximally close to the RF path. Additionally, the nanoplasma 29 created from DC path gap is induced to the RF path gap to thereby create a nanoplasma short.

The nanoplasma DC switch 41 selectively induces the nanoplasma 29 through the nanoplasma RF switch 31 based on a voltage level of the DC bias voltage $DC_{BIAS}$. For example, the DC bias voltage can be set to the first voltage level to induce the nanoplasma 29 such that the nanoplasma RF switch 31 is turned on, or to a second voltage level in which the nanoplasma 29 is not induced such that the nanoplasma RF switch 31 is turned off. In certain implementations, the DC bias circuit 45 selectively controls a voltage level of the DC bias voltage $DC_{BIAS}$ based on a state of a switch enable signal (for example, the switch enable signal $SW_{EN}$ of FIG. 2).

When the nanoplasma RF switch 31 is in a closed or ON state, the nanoplasma RF switch 31 is low impedance and conducts between the first metal pad 31a and the second metal pad 31b. However, when the nanoplasma RF switch 31 is in an open or OFF state, the nanoplasma RF switch 31 is high impedance and provides little to no conduction between the first metal pad 31a and the second metal pad 31b.

Figure 3B:
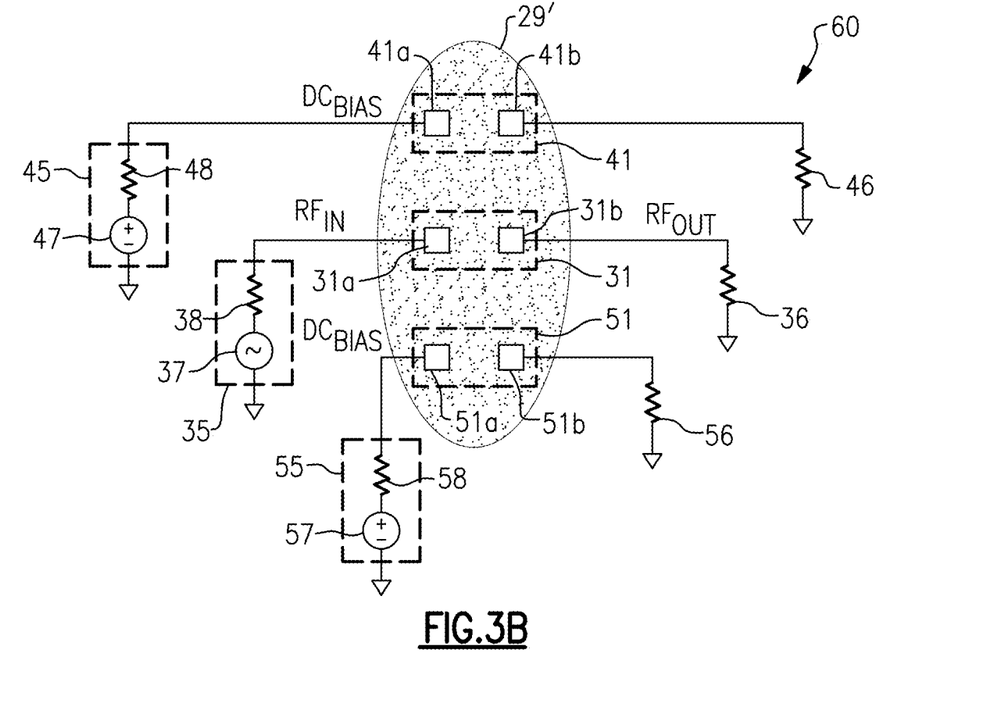
FIG. 3B is a schematic diagram of a nanoplasma switching system according to another embodiment.

FIG. 3B is a schematic diagram of a nanoplasma switching system 60 according to another embodiment. The nanoplasma switching system 60 includes a nanoplasma RF switch 31, an RF signal source 35, an RF path load resistor 36, a first nanoplasma DC switch 41, a first DC bias circuit 45, a first DC path load resistor 46, a second nanoplasma DC switch 51, a second DC bias circuit 55, and a second DC path load resistor 56.

The nanoplasma switching system 60 of FIG. 3B is similar to the nanoplasma switching system 50 of FIG. 3A, except that the nanoplasma switching system 60 further includes the second nanoplasma DC switch 51, a second DC bias circuit 55, and a second DC path load resistor 56.

As shown in FIG. 3B, the second DC bias circuit 55 is represented as a series combination of a DC voltage source 57 and a series resistor 58. The DC bias circuit 55 outputs a DC bias voltage $DC_{BIAS}$ that is provided to a first metal pad 51a of the second nanoplasma DC switch 41. Additionally, the second DC path load resistor 56 is connected between a second metal pad 51b of the second nanoplasma DC switch 41 and a reference voltage (for example, ground).

The nanoplasma switching system 60 of FIG. 3B depicts an example in which two DC bias paths are placed in close proximity to the RF path. By including two or more DC bias paths, the strength of induced nanoplasma 29' is increased.

Figure 3C:
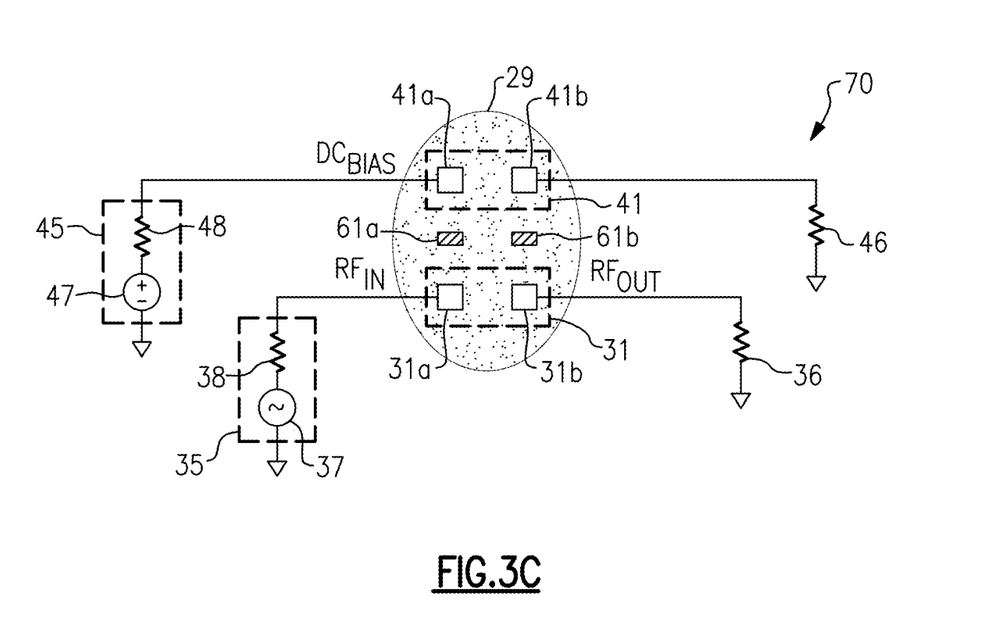
FIG. 3C is a schematic diagram of a nanoplasma switching system according to another embodiment.

FIG. 3C is a schematic diagram of a nanoplasma switching system 70 according to another embodiment. The nanoplasma switching system 70 includes a nanoplasma RF switch 31, an RF signal source 35, an RF path load resistor 36, a nanoplasma DC switch 41, a DC bias circuit 45, a DC path load resistor 46, a first isolation structure 61a, and a second isolation structure 61b.

The nanoplasma switching system 70 of FIG. 3C is similar to the nanoplasma switching system 50 of FIG. 3A except that the nanoplasma switching system 70 further includes the first isolation structure 61a interposed between the first pad 31a of the nanoplasma RF switch 31 and the first pad 41a of the nanoplasma DC switch 41, and the second isolation structure 61b interposed between the second pad 31b of the nanoplasma RF switch 31 and the second pad 41b of the nanoplasma DC switch 41.

By including the first isolation structure 61a and/or the second isolation structure 61b, enhanced isolation between the RF path and the DC bias path can be realized. For example, the presence of the isolation structures helps further improve isolation by containing and/or restricting electric fields.

Although the embodiment of FIG. 3C depicts the use of isolation structures for one DC bias path, isolation structures can also be used for implementations with two or more DC bias paths.

The isolation structures 61a/61b can be implemented in a wide variety of ways. In certain implementations, the isolation structures 61a/61b include a metal oxide such as tantalum oxide or tungsten oxide.

Figure 4A:
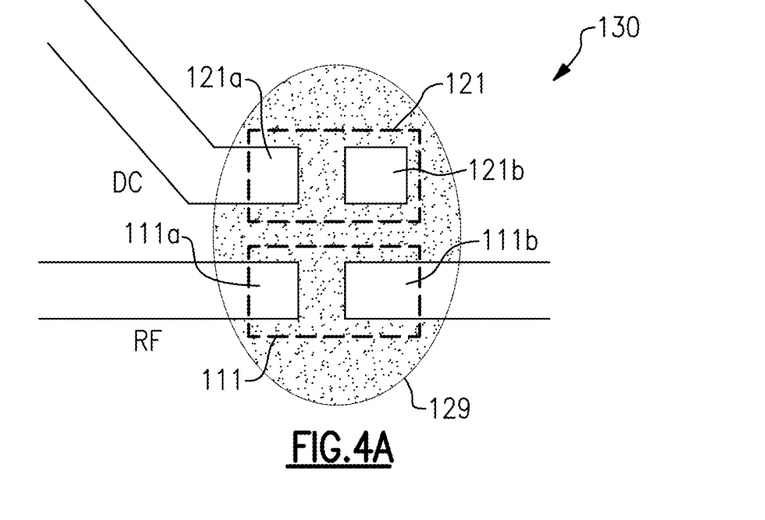
FIG. 4A is a schematic diagram of one embodiment of a planar layout for a nanoplasma switching system.

FIG. 4A is a schematic diagram of one embodiment of a planar layout 130 for a nanoplasma switching system. The planar layout 130 represents a conductor configuration for a conductive layer of a circuit board, such as a printed circuit board (PCB).

As shown in FIG. 4A, the planar layout 130 includes a nanoplasma RF switch 111 including a first metal pad 111a and a second metal pad 111b separated by a nano-gap. The planar layout 130 further includes a nanoplasma DC switch 121 including a first metal pad 121a and a second metal pad 121b separated by a nano-gap.

In the illustrated embodiment, the nanoplasma RF switch 111 is part of an RF path, while the nanoplasma DC switch 121 is part of a DC path. The DC path is included for inducing the nanoplasma 129 to the RF path. The DC path and the RF path are in a planar configuration on a common layer of a circuit board.

Figure 4B:
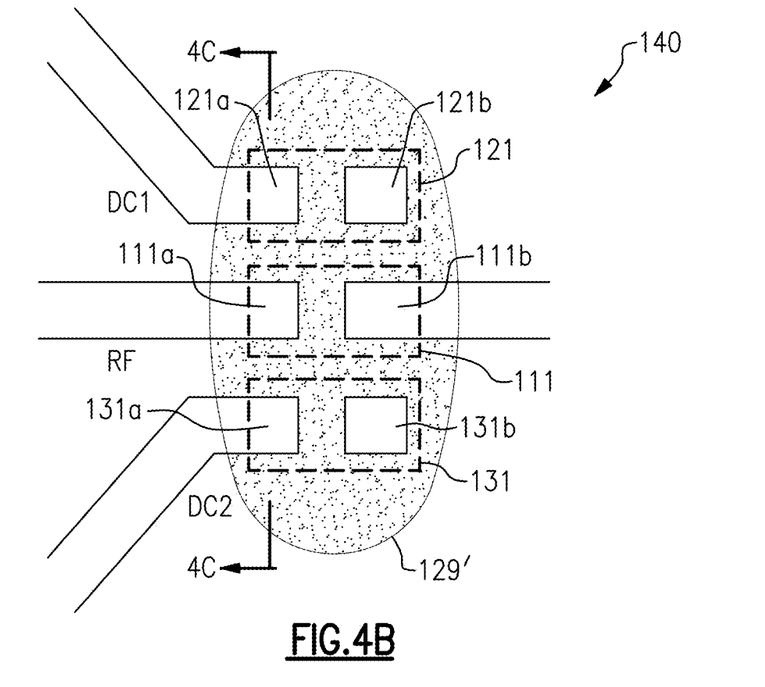
FIG. 4B is a schematic diagram of another embodiment of a planar layout for a nanoplasma switching system.

FIG. 4B is a schematic diagram of another embodiment of a planar layout 140 for a nanoplasma switching system. The planar layout 140 represents a conductor configuration for a conductive layer of a circuit board, such as a printed circuit board (PCB).

As shown in FIG. 4B, the planar layout 140 includes a nanoplasma RF switch 111 including a first metal pad 111a and a second metal pad 111b separated by a nano-gap. The planar layout 140 further includes a first nanoplasma DC switch 121 including a first metal pad 121a and a second metal pad 121b separated by a nano-gap. The planar layout 140 further includes a second nanoplasma DC switch 131 including a first metal pad 131a and a second metal pad 131b separated by a nano-gap.

In the illustrated embodiment, the nanoplasma RF switch 111 is part of an RF path, while the first nanoplasma DC switch 121 is part of a first DC path (DC1) and the second nanoplasma DC switch 131 is part of a second DC path (DC2). The DC paths and the RF path are in a planar configuration on a common layer of a circuit board.

In the illustrated embodiment, two DC paths are included for inducing the nanoplasma 129' to the RF path. By including two DC paths, the strength of the induced nanoplasma 129' is increased.

Figure 4C:
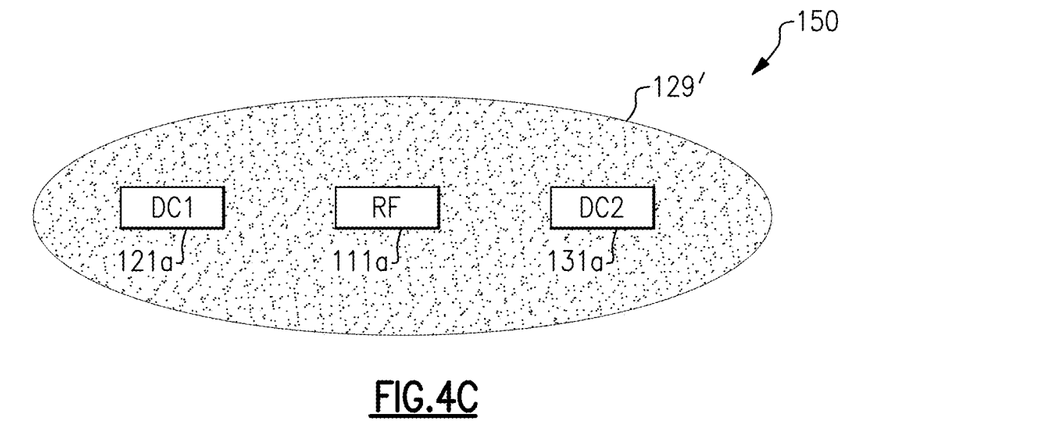
FIG. 4C is one embodiment of a cross-section of the nanoplasma switching system of FIG. 4B taken along the lines 4C-4C.

FIG. 4C is one embodiment of a cross-section 150 of the nanoplasma switching system 140 of FIG. 4B taken along the lines 4C-4C. The cross-section 150 depicts a first metal pad 121a of a first DC path (DC1), a first metal pad 111a of an RF path (RF), and a first metal pad 131a of a second DC path (DC2). In this example, the metal pads have rectangular cross-sections and the metal pads are horizontally separated by one another by any suitable dielectric.

Figure 4D:
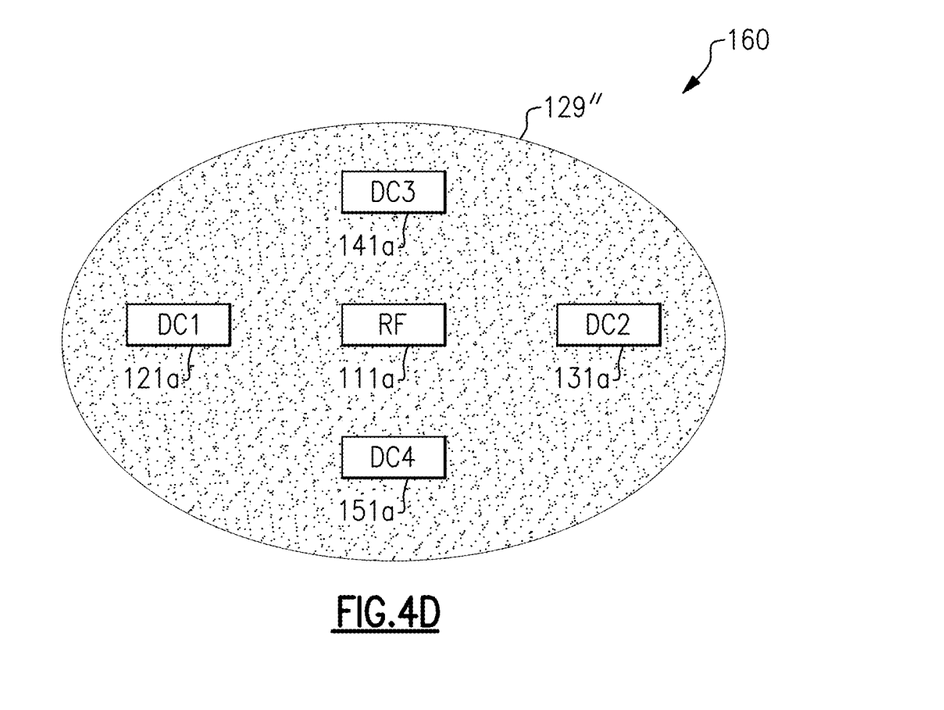
FIG. 4D is another embodiment of the cross-section of the nanoplasma switching system of FIG. 4B taken along the lines 4C-4C.

FIG. 4D is another embodiment of the cross-section 160 of the nanoplasma switching system 140 of FIG. 4B taken along the lines 4C-4C. The cross-section 160 depicts a first metal pad 121a of a first DC path (DC1), a first metal pad 111a of an RF path (RF), a first metal pad 131a of a second DC path (DC2), a first metal pad 141a of a third DC path (DC3), and a first metal pad 151a of a fourth DC path (DC4). In this example, DC paths are not only formed laterally with the RF path on a common layer of the circuit board, but also above and below the RF path on other layers of the circuit board.

By including DC paths arranged both horizontally and vertically with respect to the RF path, the strength of the induced nanoplasma 129" can be even further increased.

Figure 5A:
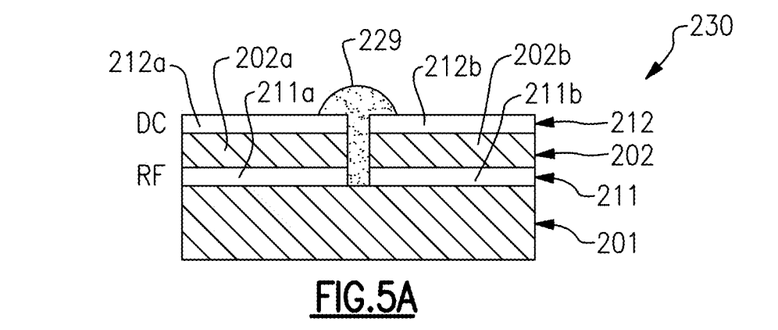
FIG. 5A is a schematic diagram of one embodiment of a vertical layout for a nanoplasma switching system.

FIG. 5A is a schematic diagram of one embodiment of a vertical layout 230 for a nanoplasma switching system. The vertical layout 230 represents a cross-section of a circuit board on which a nanoplasma switching system is formed. Any of the nanoplasma switching systems herein can be formed on a circuit board.

As shown in FIG. 5A, a nanoplasma RF switch 211 is formed on a first metal layer over a non-conductive substrate 201. The nanoplasma RF switch 211 includes a first metal pad 211a and a second metal pad 211b separated by a nano-gap. Additionally, a nanoplasma DC switch 212 has been formed on a second metal layer above the first conductive layer. The nanoplasma DC switch 212 includes a first metal pad 212a and a second metal pad 212b separated by a nano-gap.

The nanoplasma RF switch 211 and the nanoplasma DC switch 212 are separated by a non-conductive structure 202, which can correspond to a substrate and/or one or more dielectric circuit board layers. Thus, the distance between the nanoplasma RF switch 211 and the nanoplasma DC switch 212 can follow standard layer stack-ups and thickness as desired for manufacturing. The non-conductive structure 202 includes a first region 202a and a second region 202b arising from formation of the nano-gap.

In the illustrated embodiment, a DC path is included for inducing plasma to an RF path. The DC path and the RF path are in a vertical configuration on different layers of a circuit board.

Figure 5B:
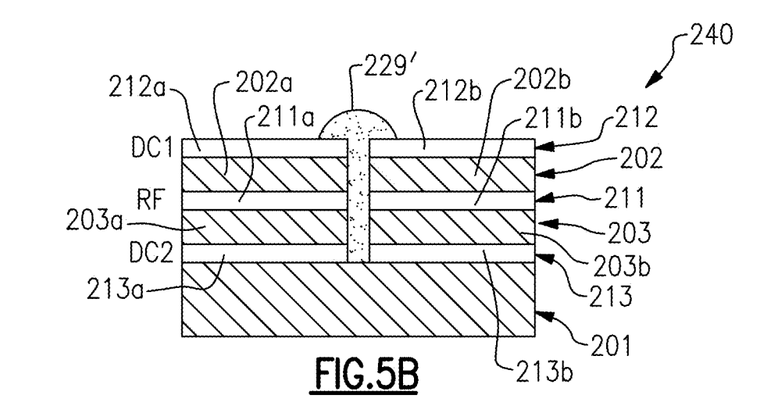
FIG. 5B is a schematic diagram of another embodiment of a vertical layout for a nanoplasma switching system.

FIG. 5B is a schematic diagram of another embodiment of a vertical layout 240 for a nanoplasma switching system.

The vertical layout 240 of FIG. 5B is similar to the vertical layout 230 of FIG. 5A, except that the vertical layout 240 further includes a second non-conductive structure 203 and a second nanoplasma DC switch 213 between the nanoplasma RF switch 211 and the substrate 201. The second nanoplasma DC switch 213 includes a first metal pad 213a and a second metal pad 213b separated by a nano-gap. The second non-conductive structure 203 can correspond to a substrate and/or one or more dielectric circuit board layers. The second non-conductive structure 203 includes a first region 203a and a second region 203b arising from formation of the nano-gap.

In the illustrated embodiment, two DC paths (DC1 and DC2) are included for inducing plasma to an RF path. The DC paths and the RF path are in a vertical configuration with each DC path and the RF path on a different layer of a circuit board.

Figure 5C:
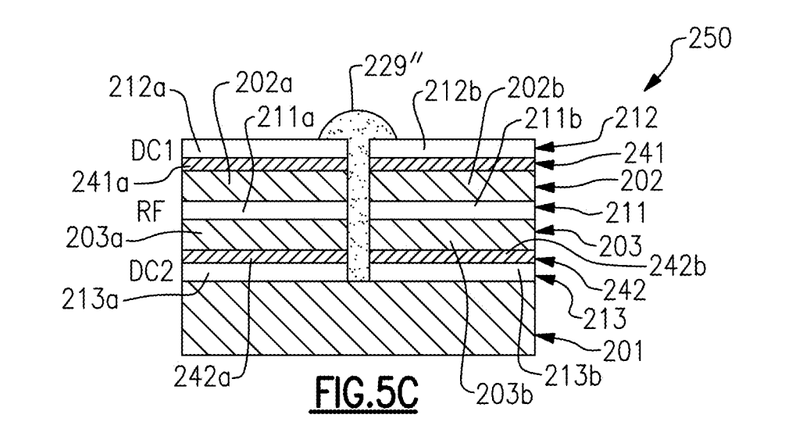
FIG. 5C is a schematic diagram of another embodiment of a vertical layout for a nanoplasma switching system.

FIG. 5C is a schematic diagram of another embodiment of a vertical layout 250 for a nanoplasma switching system.

The vertical layout 250 of FIG. 5C is similar to the vertical layout 240 of FIG. 5B, except that the vertical layout 250 further includes a first thin barrier layer 241 between the nanoplasma RF switch 211 and the first nanoplasma DC switch 212, a second thin barrier layer 242 between the nanoplasma RF switch 211 and the second nanoplasma DC switch 213. The first thin barrier layer 241 includes a first region 241a and a second region 241b arising from forma-tion of the nano-gap. Likewise, the second thin barrier layer 242 includes a first region 242a and a second region 242b arising from formation of the nano-gap.

Inclusion of the thin barrier layers 241/242 enhances isolation. The thin barrier layers 241/242 can be of any metal oxides such as oxides of tantalum, tungsten, etc. In certain implementations, the thin barrier layers 241/242 are less than 20%, or more particularly less than 10%, of the thickness of each of the non-conductive structures 202/203 (for example, core substrate layers). Although the non-conductive structures 202/203 already isolates DC and RF paths, including the thin barrier layers 241/242 helps further improve isolation by containing and restricting the electric fields.

Applications

Devices employing the above described schemes can be implemented into various electronic devices. Examples of electronic devices include, but are not limited to, RF communication systems, consumer electronic products, electronic test equipment, communication infrastructure, etc. For instance, one or more circularly polarized antenna arrays can be included in a wide range of RF communication systems, including, but not limited to, radar systems, base stations, mobile devices (for instance, smartphones or handsets), phased array antenna systems, laptop computers, tablets, and/or wearable electronics.

The teachings herein are applicable to RF communication systems operating over a wide range of frequencies, including not only RF signals between 100 MHZ and 7 GHZ, but also to higher frequencies, such as those in the X band (about 7 GHz to 12 GHz), the $K_u$ band (about 12 GHz to 18 GHZ), the K band (about 18 GHz to 27 GHZ), the $K_a$ band (about 27 GHz to 40 GHZ), the V band (about 40 GHz to 75 GHZ), and/or the W band (about 75 GHz to 110 GHz). Accordingly, the teachings herein are applicable to a wide variety of RF communication systems, including microwave communication systems.

The RF signals wirelessly communicated by the circularly polarized antenna arrays herein can be associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A nanoplasma switching system comprising:
   a nanoplasma radio frequency (RF) switch configured to receive an RF signal via an RF signal source; and
   a first nanoplasma direct current (DC) switch configured to receive a DC bias voltage via a first DC bias circuit, the first nanoplasma DC switch positioned adjacent to and spaced apart from the nanoplasma RF switch, wherein the first nanoplasma DC switch is operable to induce a nanoplasma through the nanoplasma RF switch when the DC bias voltage is set to a first voltage level.

2. The nanoplasma switching system of claim 1, wherein the nanoplasma RF switch comprises a first metal pad and a second metal pad separated by a first nano-gap.

3. The nanoplasma switching system of claim 2, wherein the first nano-gap is in the range of 5 nm to 5,000 nm.

4. The nanoplasma switching system of claim 2, wherein the first nanoplasma DC switch comprises a third metal pad and a fourth metal pad separated by a second nano-gap.

5. The nanoplasma switching system of claim 4, wherein the RF signal source is connected to the first metal pad and the first DC bias circuit is connected to the third metal pad, the nanoplasma switching system further comprising a first load connected to the second metal pad, and a second load connected to the fourth metal pad.

6. The nanoplasma switching system of claim 1, wherein the nanoplasma RF switch and the first nanoplasma DC switch are separated by a distance in the range of the range of 100 μm to 1,000 μm.

7. The nanoplasma switching system of claim 1, wherein the first nanoplasma DC switch does not induce the nanoplasma when the DC bias voltage is set to a second voltage level.

8. The nanoplasma switching system of claim 7, wherein the first DC bias circuit is configured to set the DC bias voltage to the first voltage level or the second voltage level based on a state of a switch enable signal.

9. The nanoplasma switching system of claim 8, wherein the first nanoplasma DC switch, the nanoplasma RF switch and the second nanoplasma DC switch are formed on a common layer of a circuit board.

10. The nanoplasma switching system of claim 8, wherein the first nanoplasma DC switch, the nanoplasma RF switch and the second nanoplasma DC switch are formed on different layers of a circuit board.

11. The nanoplasma switching system of claim 1, further comprising a second nanoplasma DC switch configured to receive the DC bias voltage via a second DC bias circuit, the second nanoplasma DC switch positioned adjacent to and spaced apart from the nanoplasma RF switch.

12. The nanoplasma switching system of claim 1, further comprising at least one metal oxide region interposed between the nanoplasma RF switch and the first nanoplasma DC switch.

13. A circuit board comprising:
    a substrate;
    a nanoplasma radio frequency (RF) switch formed over the substrate, the nanoplasma RF switch configured to receive an RF signal via an RF signal source; and
    a first nanoplasma direct current (DC) switch formed over the substrate and positioned adjacent to and spaced apart from the nanoplasma RF switch, the first nanoplasma DC switch configured to receive a DC bias voltage via a first DC bias circuit, wherein the first nanoplasma DC switch is operable to induce a nanoplasma through the nanoplasma RF switch when the DC bias voltage is set to a first voltage level.

14. The circuit board of claim 13, wherein the first nanoplasma DC switch and the nanoplasma RF switch are formed on a common metal layer of the circuit board.

15. The circuit board of claim 13, wherein the first nanoplasma DC switch and the nanoplasma RF switch are formed on different metal layers of the circuit board.

16. The circuit board of claim 13, further comprising a second nanoplasma DC switch formed over the substrate and positioned adjacent to and spaced apart from the nanoplasma RF switch, the second nanoplasma DC switch configured to receive the DC bias voltage via a second DC bias circuit.

17. The circuit board of claim 13, wherein the nanoplasma RF switch comprises a first metal pad and a second metal pad separated by a first nano-gap, and the first nanoplasma DC switch comprises a third metal pad and a fourth metal pad separated by a second nano-gap.

18. The circuit board of claim 17, wherein the first nano-gap and the second nano-gap are each in the range of 5 nm to 5,000 nm.

19. A method of radio frequency (RF) switching, the method comprising:
    providing an RF signal via an RF signal source to a nanoplasma RF switch;
    providing a direct current (DC) bias voltage via a first DC bias circuit to a first nanoplasma DC switch that is positioned adjacent to and spaced apart from the nanoplasma RF switch; and
    inducing a nanoplasma through the nanoplasma RF switch using the first nanoplasma DC switch by setting the DC bias voltage to a first voltage level.

20. The method of claim 19, further comprising setting the DC bias voltage to a second voltage level in which the nanoplasma is not induced via the first nanoplasma DC switch.

* * * * *